United States Patent [19]

Funaki

[11] 4,370,217
[45] Jan. 25, 1983

[54] TARGET ASSEMBLY COMPRISING, FOR USE IN A MAGNETRON-TYPE SPUTTERING DEVICE, A MAGNETIC TARGET PLATE AND PERMANENT MAGNET PIECES

[75] Inventor: Hidefumi Funaki, Fuchu, Japan

[73] Assignee: Anelva Corporation, Tokyo, Japan

[21] Appl. No.: 272,778

[22] Filed: Jun. 10, 1981

[30] Foreign Application Priority Data

Jun. 16, 1980 [JP] Japan ................................. 55/80221

[51] Int. Cl.³ .............................................. C23C 15/00
[52] U.S. Cl. .................................................. 204/298
[58] Field of Search ........................... 204/298, 192 D

[56] References Cited

U.S. PATENT DOCUMENTS 4,162,954  7/1979  Morrison ............................. 204/298
4,239,611 12/1980  Morrison ............................. 204/298

OTHER PUBLICATIONS

Chapin, Research Development Jan. 1974 pp. 37–40.

Vosen et al., Thin Film Processes Academic Press, N.Y., N.Y., pp. 134–139.

*Primary Examiner*—Arthur P. Demers
*Attorney, Agent, or Firm*—Laff, Whitesel, Conte & Saret

[57] ABSTRACT

For use in a magnetron-type sputtering device, a target assembly comprises a magnetic target plate and first and second permanent magnet pieces brought into contact with the target plate circumferentially and centrally of the target plate with differently named poles of the respective magnet pieces placed nearer to the target plate. The magnet pieces may be attached to that surface of the target plate which is directed to a hollow space of the sputtering device. Alternatively, the magnet pieces may be attached to inner and outer circumferential surfaces of the target plate, respectively. Preferably, the magnet pieces are covered with a shield cover of a conductor or the material of the target plate. A conductive body is placed in contact with the target plate on the side opposite to the above-mentioned surface to serve as an electrode. The conductive body is preferably made of a soft magnetic material.

11 Claims, 5 Drawing Figures

U.S. Patent   Jan. 25, 1983   4,370,217
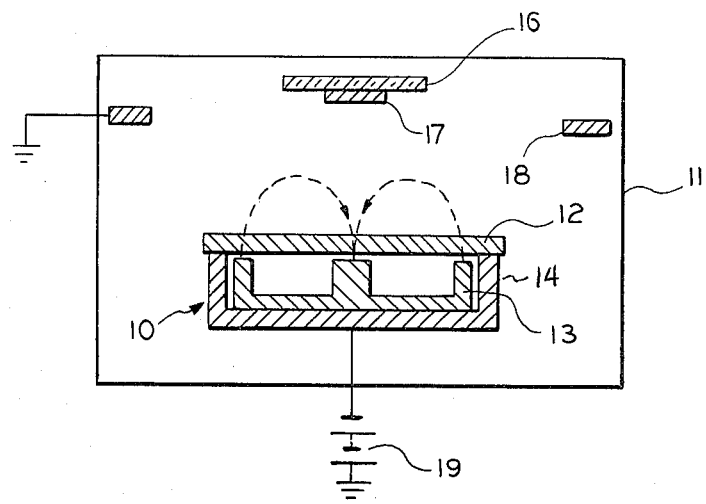
FIG. 1
(PRIOR ART)
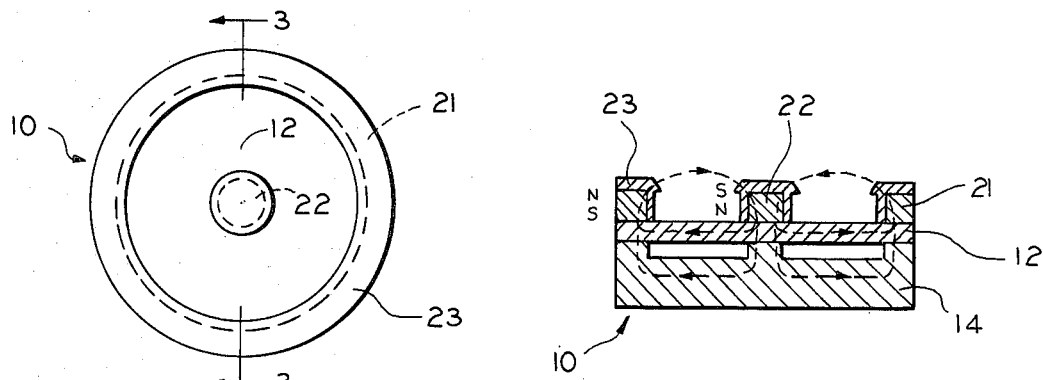
FIG. 2
FIG. 3
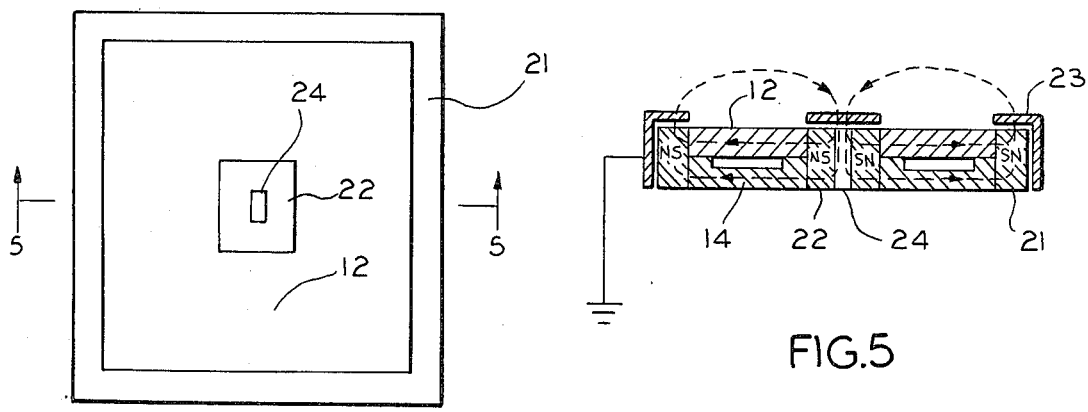
FIG. 4
FIG. 5

TARGET ASSEMBLY COMPRISING, FOR USE IN A MAGNETRON-TYPE SPUTTERING DEVICE, A MAGNETIC TARGET PLATE AND PERMANENT MAGNET PIECES

BACKGROUND OF THE INVENTION

This invention relates to a target assembly for use in a magnetron-type sputtering device.

In a sputtering device of the type described, a target assembly is located in a hollow space in order to sputter a target material onto at least one object by the help of an electric field and a magnetic field intersecting the electric field. For this purpose, the target assembly comprises a target plate of the target material, a conductive body operable as an electrode to produce the electric field in cooperation with another electrode disposed in the space, and a magnet member for producing the magnetic field.

As will later be described with reference to one of several figures of the accompanying drawing, a conventional target assembly is defective in that efficiency is inevitably degraded when use is made of a target plate of a magnetic material.

SUMMARY OF THE INVENTION

It is, therefore, an object of this invention to provide a target assembly which is suitable for a magnetron type sputtering device.

It is another object of this invention to provide a target assembly of the type described, which is capable of sputtering the material of a magnetic target plate at a high efficiency.

According to this invention, a target assembly comprises a target plate, a permanent magnet member, and a conductive body. The target plate is of a predetermined material and has a first and a second principal surface. The conductive body is brought into contact with the second principal surface. The target assembly is for use in a hollow space of a device. The device comprises means for holding at least one object in the hollow space with the object facing the first principal surface, an electrode exposed to the hollow space, and means for supplying an electric voltage between the conductive body and the electrode to produce an electric field. The permanent magnet member is for producing a magnetic field intersecting the electric field. The device is for sputtering the predetermined material primarily from the first principal surface onto the object by the help of the electric and said magnetic fields. According to this invention, the predetermined material is a magnetic material and the permanent magnet member comprises first and second permanent magnet pieces, each having a north and a south pole. The first and the second permanent magnet pieces are brought into contact with the target plate with differently named poles of the respective magnet pieces placed nearer to the target plate.

BRIEF DESCRIPTION OF THE DRAWING

FIG. 1 is a schematic vertical sectional view of a magnetron-type sputtering device comprising a conventional target assembly;

FIG. 2 is a schematic top view of a target assembly according to a first embodiment of this invention;

FIG. 3 schematically shows a sectional view taken on a line 3—3 indicated in FIG. 2;

FIG. 4 shows a schematic top view of a target assembly according to a second embodiment of this invention; and FIG. 5 schematically shows a sectional view taken on a line 5—5 indicated in FIG. 4.

DESCRIPTION OF THE PREFERRED EMBODIMENTS

Referring to FIG. 1, a conventional target assembly 10 is for use in a magnetron-type sputtering device and is located in a hollow space defined in a vessel 11 of the sputtering device. The target assembly 10 comprises a target plate 12, a permanent magnet member 3, and a conductive body 14. The target plate 12 is of a nonmagnetic material, such as aluminum or the like, and has a first or upper principal surface and a second or lower principal surface opposite to the first principal surface. The conductive body 14 has a recessed portion and is locally brought into contact with the second principal surface. A gap is formed by the recessed portion and the target plate 12. The permanent magnet member 13 is placed in the gap and has center and peripheral pole pieces exhibiting south and north poles, respectively. Thus, a magnetic field is produced by the permanent magnet member 13, as shown by broken lines representative of magnetic lines of force. Inasmuch as the target plate 12 is of the nonmagnetic material, the magnetic field appears in the hollow space through the target plate 12.

The sputtering device comprises a holder 16 for holding an object 17 in the hollow space with the object facing the first principal surface. A plurality of objects may be held on the holder, although a single object 17 is illustrated in this figure. An electrode 18 is located in the hollow space. As the electrode 18, use is possible of the vessel 11. A d.c. power source 19 is connected between the electrode 18 and the conductive body 14 to supply a d.c. electric voltage therebetween. As shown in FIG. 1, the conductive body 14 is kept at a negative electric potential. A high frequency a.c. power source may be connected to the conductive body 14, instead of the d.c. power source 19. At any rate, the electrode 18 and the conductive body 14 serve as an anode and a cathode, respectively. The conductive body 14 is electrically isolated from the vessel 11. The electric field produced between the electrode 18 and the conductive body 14 intersects the magnetic field in the hollow space outside the nonmagnetic target plate 12.

The sputtering device is suitable for sputtering the nonmagnetic material of the target plate 12 primarily from the first principal surface onto the object 17 by the help of the magnetic and the electric fields. More particularly, an argon gas is filled to a pressure between $1 \times 10^{-3}$ Torr and $1 \times 10^{-2}$ Torr in the vessel 11 after the object 17 is held on the holder 16 and the vessel 11 is evacuated by an exhausting system (not shown) to a pressure of, for example, $1 \times 10^{-6}$ Torr. The electric field is produced by energizing the power source 19. As a result, glow discharge takes place in the hollow space and brings about plasma including electrons and ions. The electrons in the plasma behave like in a so-called magnetron under presence of the electric and the magnetic fields. This means that each electron very frequently collides with the argon atoms to ionize the argon atoms. Consequently, argon ions are increased in the hollow space, as compared with a conventional reactive type sputtering device. Inasmuch as the target plate 12 is bombarded by an increased number of argon ions, it is possible with the magnetron type sputtering device to effectively sputter the nonmagnetic material of the target plate 12. In addition, the electrons almost run or drift within the magnetic field around the target plate 12 and rarely collide with the object 17. The object 17 is, therefore, scarcely adversely affected by collision of electrons. Thus, a layer of the nonmagnetic material is efficiently formed on the object 17 without any adverse affection of collision.

Herein let a ferromagnetic target plate be substituted for the nonmagnetic target plate 12. In this case, it is readily understood that magnetic lines of force almost pass through the ferromagnetic target plate and scarcely appear outside the target plate. In other words, a magnetic field is not produced in the hollow space outside the target plate. This means that electrons are no longer subjected to influence of a magnetic field. As a result, the magnetic field can not be effectively utilized with the conventional target assembly 10.

Referring to FIGS. 2 and 3, a target assembly 10 according to a first embodiment of this invention is for use in a magnetron type sputtering device, as is the case with the target assembly 10 illustrated in FIG. 1, and comprises similar parts designated by like reference numerals. Herein, the target plate 12 is of a ferromagnetic material, such as ferrite, iron, nickel, cobalt, or the like, and has first and second principal surfaces, like in FIG. 1. As shown in FIG. 3, the target plate 12 is of a circular shape. The target assembly comprises, as the permanent magnet member 13 illustrated with reference to FIG. 1, first and second permanent magnet pieces 21 and 22, each having north (N) and sourth (S) poles. The first and the second permanent magnet pieces 21 are brought into contact with the target plate 12 with differently named poles of the respective pieces 21 and 22 placed nearer to the target plate 12. In the illustrated assembly 10, the first permanent magnet piece 21 is brought into contact with the first principal surface of the target plate 12 circumferentially of the target plate 12 while the second permanent magnet piece 22 is brought into contact with the first principal surface centrally of the target plate 12. The south and the north poles of the first and the second pieces 21 and 22 are adjacent to the first principal surface.

A ferromagnetic shield cover 23 is disposed on each of the first and the second permanent magnet pieces 21 and 22. Preferably, the shield cover 23 is of the same material as the target plate 12, as will become clear as the description proceeds.

In FIG. 2, the conductive body 14 comprises a pedestal portion, a first projection projected from the pedestal portion and having a free end brought into contact with the second principal surface, and a second projection projected from the pedestal portion and having a free end brought into contact with the second principal surface centrally of the second principal surface. Thus, the conductive body 14 is locally attached to the second principal surface with a gap left therebetween. In order to cool the target assembly 10, water coolant may be caused to flow through the gap from an inlet (not shown) to an outlet (not shown). It is desirable that the conductive body 14 is of a soft magnetic material, such as iron or the like, which has a low magnetic resistance, as will be presently described.

According to the above-mentioned arrangement of the first and the second permanent magnet pieces 21 and 22, a magnetic field is produced in the hollow space beteen the first and the second permanent magnetic pieces 21 and 22, as indicated by broken lines representative of magnetic lines of force. The magnetic field intersects, in the hollow space adjacent to the target assembly 10, the electric field described with reference to FIG. 1. Thus, the target plate 12 is effectively bombarded by argon ions under presence of the magnetic and the electric fields, so as to sputter the ferromagnetic material of the target plate 12 onto the object shown in FIG. 1.

On sputtering, the shield cover 23 is also bombarded by the argon ions. Inasmuch as the shield cover 23 is formed by the same ferromagnetic material as the target plate 12, the ferromagnetic material of the shield cover 23 is sputtered onto an object shown in FIG. 1. It is possible with this assembly 10 to prevent the first and the second permanent magnet pieces 21 and 22 from being bombarded by argon ions during the sputtering process.

As shown in FIG. 2, the conductive body 14 serves as a part of magnetic paths in cooperation with the target plate 12 and has a low magnetic resistance, as described before. This structure is advantageous in that the magnetic field is kept invariable even when the target plate 12 becomes thin as a result of the sputter and high in magnetic resistance after it is used for a long term.

Referring to FIGS. 4 and 5, a target assembly according to a second embodiment of this invention comprises similar parts designated by like reference numerals. The illustrated target plate 12 has inner and outer circumferential surfaces. The inner circumferential surface defines a rectangular window and the outer circumferential surface is opposite to the inner circumferential surface. Like in FIGS. 2 and 3, the first permanent magnet piece 21 is disposed circumferentially of the target plate 12 while the second permanent magnet piece 22, centrally of the target plate 12. More particularly, the first permanent magnet piece 21 is brought into contact with the outer circumferential surface with the south pole (S) thereof placed nearer to the target plate 12. The second permanent magnet piece 22 of a rectangular shape has an inside surface defining an inside space and an outside surface surrounding the inside surface. A soft magnetic spacer 24 is filled in the inside space. The south and the north poles appear on the inside and the outside surfaces, respectively. The second permanent magnet piece 22 is brought into contact with the target plate 12 along the inner circumferential surface with the north pole (N) thereof placed nearer to the target 12. Thus, differently named poles of the first and the second permanent magnet pieces 21 and 22 are placed nearer to the target plate 14. Magnetic paths are formed as shown by magnetic lines of force in FIG. 5 and a magnetic field appears in the hollow space between the first and the second permanent magnetic pieces 21 and 22.

In FIG. 5, each of the first and the second permanent magnet pieces 21 and 22 is covered with a shield cover 23 of a conductor with a slight gap left therebetween. The shield cover 23 is grounded together with the electrode 18 or the vessel 11, each being illustrated in FIG. 1. In this structure, the target plate 12 is bombarded by ions while the shield cover 23 and each magnet piece beneath the shield cover 23 are not bombarded by any ions. This is because the shield cover 23 is as electrically operable as the electrode 18 or the vessel 11.

Further referring to FIG. 5, the conductive body 14 comprises the pedestal portion, the first projection, and the second projection, as is the case with that illustrated with reference to FIG. 3. Both of the first and the second projections are brought into contact with the target plate 12 circumferentially and centrally of the target plate 12, respectively. The illustrated first and second projections are also brought into contact with the first and the second permanent magnet pieces, respectively. The conductive body 14 has an inner side surface defining a duct or passage in conformity with the window formed in the target plate 12. The duct serves to receive the second permanent magnetic piece 22 in cooperation with the window. Thus, the conductive body 14 forms a part of the magnetic paths drawn in FIG. 5 and is operable as an electrode.

While this invention has thus far been described in conjunction with a few embodiments thereof, it will be readily possible for those skilled in the art to put this invention in practice in various manners. For example, either one of the first and the second permanent magnet pieces 21 and 22 shown in FIG. 5 is placed on the target plate 12 in a manner shown in FIG. 3. In this case, the permanent magnet piece placed on the target plate 12 is brought into contact with the first principal surface of the target plate 12 with one of the poles placed nearer to the first principal surface. The remaining magnet piece is brought into contact with the inner or the outer circumferential surface (FIG. 5) of the target plate 12 with the other pole placed nearer to the target plate 12. In FIG. 5, the shield cover 23 may be of a ferromagnetic material like in FIG. 3 and is attached to each magnetic piece.

What is claimed is:

1. In a target assembly comprising a target plate, a permanent magnet member, and a conductive body, said target plate being of a predetermined material and having a first and a second principal surface, said conductive body being brought into contact with said second principal surface, said target assembly being for use in a hollow space of a device comprising means for holding at least one object in said hollow space with said object facing said first principal surface, an electrode exposed to said hollow space, and means for supplying an electric voltage between said conductive body and said electrode to produce an electric field, said permanent magnet member being for producing a magnetic field intersecting said electric field, said device being for sputtering said predetermined material primarily from said first principal surface onto said object by the help of said electric and said magnetic fields, the improvement wherein:

said predetermined material is a magnetic material;
said permanent magnet member comprising first and second permanent magnet pieces, each having a north and a south pole, said first and said second permanent magnet pieces being brought into contact with said target plate with differently named poles of the respective magnet pieces placed nearer to said target plate.

2. A target assembly as claimed in claim 1, wherein said first permanent magnet piece is disposed circumferentially of said target plate, said second permanent magnet piece being disposed centrally of said first principal surface.

3. A target assembly as claimed in claim 2, wherein said first and said second permanent magnet pieces are brought into contact with said first principal surface.

4. A target assembly as claimed in claim 2, said target plate having an outer circumferential surface, wherein said first permanent magnet piece is brought into contact with said outer circumferential surface.

5. A target assembly as claimed in claim 4, wherein said second permanent magnet piece is brought into contact with said first principal surface.

6. A target assembly as claimed in claim 4, wherein said target plate has an inner circumferential surface, said second permanent magnet piece being brought into contact with said target plate along said inner circumferential surface.

7. A target assembly as claimed in claim 2, wherein said target plate has an inner circumferential surface, said first permanent magnet piece being disposed on said first principal surface, said second permanent magnet piece being brought into contact with said target plate along said inner circumferential surface.

8. A target assembly as claimed in any one of claims 1 through 7, further comprising a shield cover covering the respective permanent magnet pieces.

9. A target assembly as claimed in claim 8, wherein said shield cover is of the same magnetic material as said target plate and is attached to the respective permanent magnet pieces.

10. A target assembly as claimed in claim 8, wherein said shield cover is electrically conductive and is placed with a gap left between said shield cover and each of said first and said second permanent magnet pieces.

11. A target assembly as claimed in claim 10, wherein said conductive body comprises:
a pedestal portion;
a first projection projected from said pedestal portion and having a free end brought into contact with said second principal surface circumferentially of said second principal surface; and
a second projection projected from said pedestal portion and having a free end brought into contact with said second principal surface centrally of said second principal surface.

* * * * *

UNITED STATES PATENT AND TRADEMARK OFFICE
CERTIFICATE OF CORRECTION

PATENT NO. : 4,370,217
DATED : January 25, 1983
INVENTOR(S) : HIDEFUMI FUNAKI

It is certified that error appears in the above—identified patent and that said Letters Patent is hereby corrected as shown below:

Col. 2, Line 13, "member 3" should be --member 13--;

Col. 3, Line 68, "beteen" should be --between--.

Signed and Sealed this

Twenty-eighth Day of June 1983

[SEAL]

Attest:

GERALD J. MOSSINGHOFF

Attesting Officer

Commissioner of Patents and Trademarks